United States Patent
Herschbach et al.

(10) Patent No.: US 9,318,877 B2
(45) Date of Patent: Apr. 19, 2016

(54) COMPACT LASER SOURCE FOR ACTIVE ILLUMINATION FOR HYBRID THREE-DIMENSIONAL IMAGERS

(71) Applicant: IEE INTERNATIONAL ELECTRONICS & ENGINEERING S.A., Echternach (LU)

(72) Inventors: Norbert Herschbach, Medernach (LU); Jean-Luc Kaiser, Erpeldange (LU)

(73) Assignee: IEE INTERNATIONAL ELECTRONICS & ENGINEERING S.A., Luxembourg (LU)

( * ) Notice: Subject to any disclaimer, the term of this patent is extended or adjusted under 35 U.S.C. 154(b) by 29 days.

(21) Appl. No.: 14/382,545

(22) PCT Filed: Mar. 1, 2013

(86) PCT No.: PCT/EP2013/054120
§ 371 (c)(1),
(2) Date: Sep. 2, 2014

(87) PCT Pub. No.: WO2013/127975
PCT Pub. Date: Sep. 6, 2013

(65) Prior Publication Data
US 2015/0092258 A1      Apr. 2, 2015

(30) Foreign Application Priority Data
Mar. 1, 2012   (LU) .......................... 91951

(51) Int. Cl.
| H01S 5/00 | (2006.01) |
| H01S 5/42 | (2006.01) |
| G01S 17/02 | (2006.01) |
| G01S 17/89 | (2006.01) |

(Continued)

(52) U.S. Cl.
CPC ............... *H01S 5/423* (2013.01); *G01S 7/4815* (2013.01); *G01S 17/023* (2013.01); *G01S 17/89* (2013.01);
(Continued)

(58) Field of Classification Search
CPC ..... H01S 5/423; H01S 5/06203; G01B 11/25; G01S 17/89
USPC ................... 359/238; 372/50.1, 50.12, 50.124
See application file for complete search history.

(56) References Cited

U.S. PATENT DOCUMENTS

| 7,496,122 B2 | 2/2009 | Bozso et al. |
| 2008/0049799 A1 | 2/2008 | Bozso et al. |

(Continued)

FOREIGN PATENT DOCUMENTS

| CN | 1971340 A | 5/2007 |
| CN | 101347002 A | 1/2009 |

(Continued)

OTHER PUBLICATIONS

International Search Report issued Jun. 28, 2013 re: PCT/EP2013/054120.

(Continued)

*Primary Examiner* — Tuyen Tra
(74) *Attorney, Agent, or Firm* — Cantor Colburn LLP

(57) ABSTRACT

The invention generally relates to hybrid three-dimensional imagers and to a laser source for active illumination for hybrid three-dimensional imagers (i.e. 3D imagers that make combined use of different 3D imaging technologies). The invention is applicable to three-dimensional imaging systems which use a combination of different imaging techniques (hybrid technologies) to achieve a higher precision or a higher level of reliability.

6 Claims, 1 Drawing Sheet

(51) Int. Cl.
   *G01S 7/481* (2006.01)
   *H04N 13/02* (2006.01)
   *H01S 5/062* (2006.01)
   *G01B 11/25* (2006.01)

(52) U.S. Cl.
   CPC .......... *H01S 5/0085* (2013.01); *H01S 5/06203* (2013.01); *H04N 13/025* (2013.01); *H04N 13/0253* (2013.01); *G01B 11/25* (2013.01)

(56) References Cited

U.S. PATENT DOCUMENTS

| | | | |
|---|---|---|---|
| 2009/0225244 A1 | 9/2009 | Wang et al. | |
| 2012/0274559 A1* | 11/2012 | Mathai | G02B 5/0278 345/158 |

FOREIGN PATENT DOCUMENTS

| | | |
|---|---|---|
| CN | 101526674 A | 9/2009 |
| DE | 102005028570 A1 | 12/2006 |
| DE | 102009040991 A1 | 4/2011 |
| WO | 2005011292 A1 | 2/2005 |

OTHER PUBLICATIONS

C. L. Chua et al. "Independently Addressable VCSEL Arrays on 3-μm Pitch," IEEE Photonics Technology Letters, Jul. 1998, vol. 10, pp. 917-919.

C. Wheeler et al. Monolithic Integration of GaAs Optoelectronic Devices Using Thermal Oxide Isolation (TO1), SPIE Photonics West, Proceedings of International Society for Optical Engineering (SPIE), 1997, vol. 3003, pp. 75-84.

Giorgio Giaretta et al. "A Novel 4x8 Single-Mode Independently Addressable Oxide-Isolated VCSEL Array," IEEE Photonics Technology Letters, Sep. 1997, vol. 9, pp. 1196-1198.

M.K. Hibbs-Brenner et al. "A Monolithic Integration Approach for VCSEL/GaAs FET Arrays", Integrated Optoelectronics, 1994, Proceedings of IEE/LEOS Summer Topical Meetings pp. 54-55.

R. King et al., "Oxide Confined 2D VCSEL Arrays for High-Density Inter/Intra-Chip Interconnects," Proc. SPIE, 1998, vol. 3286, pp. 64-71.

Y. J. Yang et al. "Monolithic integration of a vertical cavity surface emitting laser and a metal semiconductor field effect transistor", Applied Physics Letters, 1993, vol. 62, pp. 600-602, American Institute of Physics.

Yongchang Wang et al., "Data Acquisition and Quality Analysis of 3-Dimensional Fingerprints," IEEE conference on Biometrics, Identity and Security, Tampa, Florida, Sep. 22-24, 2009.

Yongchang Wang et al., "Multicamera Phase Measuring Profilometry for Accurate Depth Measurement," Proceedings of SPIE, the International Society for Optical Engineering, Orlando, Florida, vol. 6555, Apr. 9-15, 2007.

Chinese Office Action issued Oct. 9, 2015 re: Application No. 201380012118.X; pp. 1-12; citing: CN1971340A and CN101526674A; CN 101347002 A, WO 2005/011292 A1.

* cited by examiner

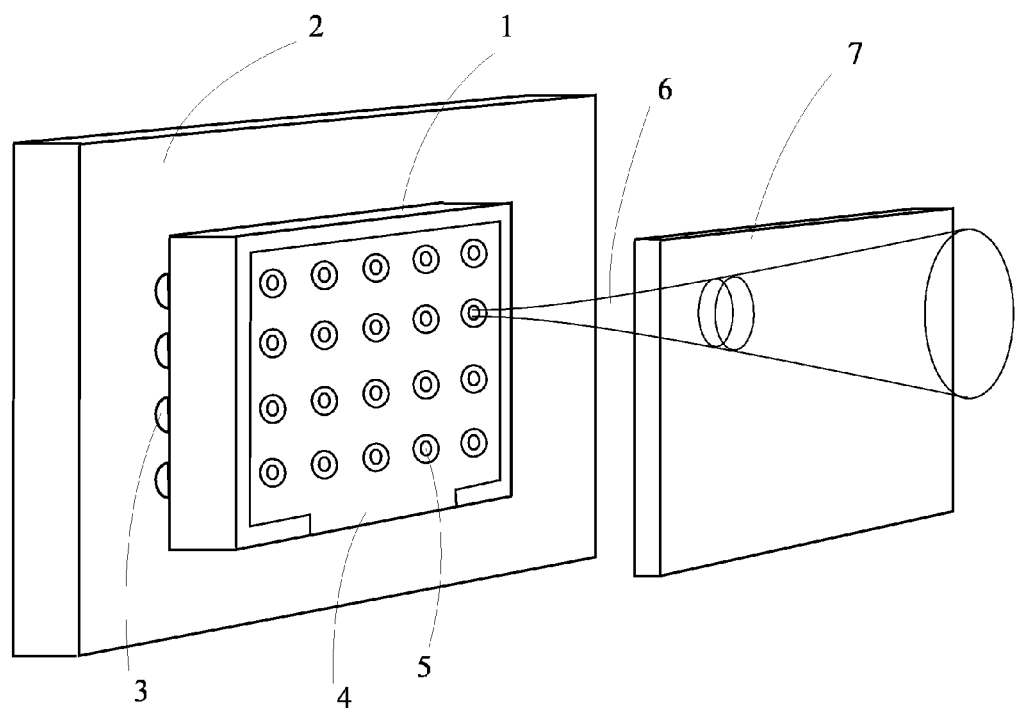

COMPACT LASER SOURCE FOR ACTIVE ILLUMINATION FOR HYBRID THREE-DIMENSIONAL IMAGERS

TECHNICAL FIELD

The present invention generally relates to a (compact) laser source for active illumination for hybrid three-dimensional imagers (i.e. 3D imagers that make combined use of different 3D imaging technologies). The invention is applicable to three-dimensional imaging systems which use a combination of different imaging techniques (hybrid technologies) to achieve a higher precision or a higher level of reliability.

BACKGROUND ART

The three-dimensional (also: 3D) imaging technologies, time-of-flight cameras (3D-LMI), structured-light 3D imaging and stereovision systems all have specific weaknesses and drawbacks as well as advantages depending on the specific conditions encountered in the scene to be analyzed. Examples are background illumination conditions, presence or absence of particular surface texture pattern in objects, size of the objects, or the speed of objects in the scene. By combining three-dimensional measurement techniques, which are partially complementary in their performance, a higher precision and a higher reliability level can be achieved. In this respect, also a combination with additional high-resolution 2D imaging can be useful. The different 3D techniques require each a highly specialized illumination system. If each illumination system were to be implemented separately, this would represent a large cost contribution in hybrid systems, as the cost for high power lasers is high. In addition, it is difficult to integrate elegantly several separate illumination systems for the different types of imaging of hybrid systems into a compact instrument.

A list of reference documents can be found at the end of the detailed description.

BRIEF SUMMARY

The invention solves other problems apart from cost problems of hybrid three-dimensional imagers. In particular, time-of-flight imaging requires fast switching speed and high modulation frequencies. Typically, difficulties related to the required large currents in the order of 50 A and to the inductance of leads connecting the switching current source to the semiconductor laser device, for example a Vertical Cavity Surface Emitting Laser (VCSEL) array can severely limit achievable switching speeds. Structured-light field generation using masks in the output beam of the laser source is unnecessarily complicated, involves additional manufacturing processes and is inefficient with regard to the fraction of the produced laser light effectively used for illumination as part of the emitted light is lost at the mask.

The weaknesses of the different three-dimensional imaging techniques as well as the conditions in which they manifest themselves are at least partially different from one system to the other. Hence, a greater reliability and precision in the 3D-data of the scene is achieved when hybrid three-dimensional imaging systems are used. Also algorithmic decision-making on data from multiple three-dimensional sensors becomes possible.

We propose a laser source capable to deliver the specialized illumination performance required by time-of-flight cameras, structured-light field based 3D imaging and stereovision imaging as well. The light source is based on monolithically integrated VCSELs in an array. By separate electrical connection of the individual VCSELs independent switching of the individual laser elements or groups of single laser units are possible. Additionally, to enable fast switching and high frequency modulation of single VCSELs, groups of them or of the array of VCSELs as a whole, transistors for switching each individual VCSEL can be integrated within the laser array chip or on a separate driver chip to which the laser chip is connected using the flip-chip technique. Furthermore, as an option, we propose a switchable diffuser element in front the light source, which allows a switching between a structured-light field illumination mode and an illumination with a smooth, unstructured light field.

BRIEF DESCRIPTION OF THE DRAWINGS

A preferred embodiment of the invention will now be described, by way of example, with reference to the accompanying drawing in which:

FIG. 1 shows a schematic set up of a possible embodiment of the invention.

DESCRIPTION OF PREFERRED EMBODIMENTS

Combining different measurement techniques to obtain three-dimensional data has many advantages. Generally improvements in precision and quality of the 3D-data can be expected as has been shown, for example, for the combination of structured light and stereovision techniques [Yonchang2007]. Different measurement techniques do also complement one another as the conditions under which one technique performs poorly are still favorable for the good performance of another system. Combining different measurement techniques also improves reliability.

Switching individual VCSEL using a monolithically integrated transistor in one and the same semiconductor wafer was achieved in the 90's and applied to arrays of VCSELs as well [Yang1992, Hibbs-Brenner1994, Wheeler1997]. Alternatively, VCSEL array chips can be bump-bonded on CMOS chips (flip-chip method) containing the switching driver electronics. Large modulation frequencies and switching speed in the 10 GHz range are commonly achieved in optical telecommunication devices.

Electronically switchable diffusers also known as smart glasses or smart windows are known since some time and are used as switchable glass panels in buildings, car roofs, airplanes and trains like the German ICE 3, to dim sunlight from the exterior or to prevent visibility in order to create privacy. Several materials and techniques are known to produce the effect. As an example polymer dispersed liquid crystals can be mentioned.

A preferred embodiment of a device according to the invention is shown in FIG. 1. The reference numbers designate:
1 a VCSEL array chip
2 a chip containing driver electronics
3 a bump flip-chip connection
4 an electrode
5 a single VCSEL
6 a laser beam from individual VCSEL
7 a switchable diffuser.

At the heart of the illumination source for hybrid three-dimensional imagers is a VCSEL array chip. The arrangement of the individual VCSELs within the array can be designed to produce a spatially coded structured light field if the structured light method is used. Several techniques are possible to achieve switching and modulation of individual VCSELs, of groups of VCSELs or of the entire array. When a transistor for each VCSEL is integrated within the laser array chip, matrix addressing of the array is feasible. Independent connection of each laser unit is possible as well, but becomes unpractical for larger arrays. Alternatively, the current modulation and switching circuit for each VCSEL can be integrated into a second chip of CMOS type for example. The switching circuit chip and the laser chip are connected using a flip chip technique.

A switchable diffuser can be mounted in front of the laser chip in order to enable switching between a structured-light mode, when the diffuser is fully transparent, and an operation mode generating a smooth flat illumination field, when the diffuser is switched on. The switchable diffuser can be based, for example, on polymer dispersed liquid crystals.

Additional optical elements required to obtain an illumination field as desired regarding field of view and light distribution, are not shown in FIG. 1.

Thanks to the invention, the cost of illumination systems for hybrid three-dimensional imaging instruments may be drastically reduced. The proposed integration into a single illumination system leads to simpler and more compact technical realizations.

Switching speed which is crucial for the time-of-flight technique, can become very large, up to values in the GHz range, by integrating the current switching circuits as proposed directly on the laser array wafer or by using flip-chip technology and connect the laser chip directly on a dedicated CMOS chip containing the current switching circuits.

The ability to switch individual VCSELs within the array or groups of them opens up new possibilities when applying the structured light technique.

The required coded structure in the light field can be achieved by directly coding the VCSEL array electronically, which gives a large freedom to change the pattern as desired. Problems of ambiguity can be solved by taking an additional picture of the scene with a programmed change in the coded illumination pattern such that the ambiguity is lifted.

In addition, with the capability of switching individual VCSELs or groups of VCSELs a greater flexibility is provided to adapt the illumination to bad atmospheric conditions with reduced visibility range, like fog, rain, or dust. In case of fog, for example, it is advantageous to reduce the field of view of the illumination in the horizontal direction in order to reduce the amount of diffusely scattered light on the detector from less important angles of view. This improves the signal quality and the reliability of detection of objects in the restricted angle of view. For structured-light imaging, alternatively or additionally the pattern of illumination can be adapted to bad atmospheric conditions by reducing the density of the illumination pattern in the entire field of view or within regions.

With an electronically switchable diffuser as proposed it becomes possible to switch the illumination system between a structured light mode of operation and a mode of operation giving a smooth unstructured light field, as preferable for time-of-flight imaging, stereovision at night or other detection techniques like high resolution 2D imaging.

The invention claimed is:

1. A hybrid three-dimensional imaging instrument, comprising a laser based illumination source including an array of individual Vertical Cavity Surface Emitting Laser (VCSEL) and a switchable diffuser mounted in front of said array of VCSELs, said switchable diffuser being configured to be switchable between a structured-light mode, in which said diffuser is essentially transparent, and a diffuse operation mode, in which said diffuser generates a smooth and unstructured illumination field.

2. The hybrid three-dimensional imaging instrument according to claim 1, wherein said illumination source further comprises a monolithically integrated switching circuit, said monolithically integrated switching circuit being arranged close to said array of VCSELs and configured for fast current switching or modulation of each individual VCSEL, groups of VCSELs or the VCSEL array as a whole, for more efficient, flexible and precise modulation of the light field required for the time-of-flight technique.

3. The hybrid three-dimensional imaging instrument according to claim 1, wherein integration of the required transistors is realized either directly within the laser array chip or within a dedicated second chip to which the laser array chip is connected using a flip-chip technique.

4. The hybrid three-dimensional imaging instrument according to claim 1, wherein said illumination source is configured for generating structured light field for the structured-light technique by encoding a pattern driving the individual VCSELs within the array of VCSELs with different intensities, either using a range of drive currents or switching individual lasers on or off.

5. The hybrid three-dimensional imaging instrument according to claim 1, wherein said illumination source is configured for flexible switching of individual VCSELs or groups of VCSELs enabling additional methods to lift ambiguities in the structured-light operation.

6. The hybrid three-dimensional imaging instrument according to claim 1, wherein said illumination source is configured for switching of individual or groups of VCSELs allowing an adaptation of the illumination to atmospheric conditions by restricting a solid angle of active illumination to an essentially important part of the field of view, or, in case of the structured-light technique, by emitting a pattern of illumination of reduced density.

* * * * *